United States Patent [19]
Wakino et al.

[11] Patent Number: 4,931,354
[45] Date of Patent: Jun. 5, 1990

[54] MULTILAYER PRINTED CIRCUIT BOARD

[75] Inventors: Kikuo Wakino, Muko; Harufumi Mandai, Takatsuki, both of Japan

[73] Assignee: Murata Manufacturing Co., Ltd., Japan

[21] Appl. No.: 265,500

[22] Filed: Nov. 1, 1988

[30] Foreign Application Priority Data

Nov. 2, 1987 [JP] Japan ................................. 62-278837
Nov. 2, 1987 [JP] Japan ................................. 62-278838

[51] Int. Cl.$^5$ ............................................. B32B 9/00
[52] U.S. Cl. .................................... 428/209; 428/210;
428/426; 428/432; 428/433; 428/901; 501/119;
501/120; 501/125; 501/66; 501/77; 501/153;
501/154; 174/266; 361/397
[58] Field of Search ................. 501/119, 120, 125, 66,
501/77, 153, 154; 428/209, 210, 426, 432, 433,
901; 174/68.5; 361/397

[56] References Cited

U.S. PATENT DOCUMENTS 4,502,939 3/1985 Holfelder et al. ...................... 156/89
4,627,160 12/1986 Herron et al. ......................... 156/89

Primary Examiner—Patrick Ryan
Attorney, Agent, or Firm—Ostrolenk, Faber, Gerb & Soffen

[57] ABSTRACT

A multilayer printed circuit board comprises plural insulating layers integrated into one body, and internal wiring conductor layers located on the internal insulating layers, characterized in that conductor paths in each internal conductor layer are locally separated from the insulating layer by a cavity or porous layer provided at the boundaries between the path and insulating layer adjacent thereto. At least one insulating layer between internal conductor layers may be provided with a layered space or porous layer therein.

6 Claims, 2 Drawing Sheets

MULTILAYER PRINTED CIRCUIT BOARD

FIELD OF THE INVENTION

The present invention relates to a multilayer printed circuit board and, more particularly, to a multilayer printed circuit board suitable for use in electronic devices designed to handle signals with a high frequency.

BACKGROUND OF THE INVENTION

Heretofore, a multilayer printed circuit boards, have been made up of organic high molecular compounds as glass epoxy resins since these materials have a low dielectric constant of about 4 and are simple to manufacture. It is, however, impossible to directly mount integrated circuit (IC) chips on these multilayer circuit boards because of their poor thermal resistance. In addition, it is impossible with such a material to produce multilayer printed circuit boards comprising 20 to 30 insulated internal layers.

To this end, multilayer printed circuit boards employing an alumina ceramic, as a material for insulators, have been developed and put into practical use. However, the use of alumina ceramics provides new problems because of its large dielectric constant of 9 to 10. With speeding up of operations of such electronic devices as super computers, there is an increasing tendency to use clock pulses with a high frequency of 100 to 300 MHz. At such high frequencies, the greater the dielectric constant of the insulator for multilayer boards, the greater is the delay of propagation of signals in the area where the conductors with a long length are provided. In addition, the use of a large dielectric constant insulator causes an increase of electrostatic capacitance between neighboring wiring conductors, which in turn results in attenuation of signals as well as a decrease of circuit impedance.

In order to solve these problems, there have been proposed a few multilayer printed circuit boards with new constructions. For example, Japanese patent published No. 39077/1981 discloses a multilayer printed circuit board comprising an alumina substrate and conductor layers separated by an insulating layer; each insulating layer being arranged between conductor layers and composed of a low dielectric constant material consisting essentially of 50 to 64% of $SiO_2$, 18 to 25% of $B_2O_3$, 2 to 3% of $Al_2O_3$, 1 to 2% of $Na_2O$, 1 to 3% of $K_2O$, 6 to 9% of PbO, 0.25 to 0.5% of CaO and 0.25 to 0.5% of $MnO_2$.

Japanese patent laid-open No. 15098/1981 discloses a multilayer printed circuit board comprising a ceramic substrate on which several metallized layers and thin ceramic layers are alternately stacked on one another. A cavity layer parallel to the metallized layer is provided in the thin ceramic layer located between adjacent metallized layers.

However, there is an increasing demand for development of multilayer printed circuit boards with a lower dielectric constant that can be easily manufactured.

SUMMARY OF THE INVENTION

It is therefore an object of the present invention to provide a multilayer printed circuit board with a construction that makes it possible to lower the dielectric constant of the board.

Another object is to provide a multilayer printed circuit board with a less propagation time and lower attenuation of signals even at high frequencies.

These and other objects are achieved by providing a multilayer printed circuit board comprising a plurality of insulating layers integrated into one body, and internal wiring conductor layers located on the internal insulating layers, characterized in that conductor paths in each internal conductor layer are locally separated from the insulating layer located on said conductor layer by a cavity or porous layer provided at the boundaries between said paths and insulating layer.

In a preferred embodiment, each cavity or porous layer is provided between the whole surface area of one side of the conductor and the insulating layer facing thereto.

In another embodiment, the multilayer board is composed of insulating layers of the cordierite type ceramic composition, with the internal wiring conductors being made of copper.

In another preferred embodiment, at least one of the insulating layers located between the internal wiring conductor layers has a layered space or a porous layer provided therein. In this case, it is preferred to avoid the formation of a layered space or porous layer in the areas which surround the through holes, in order to prevent the conductors formed in the through hole from deforming.

As a material for insulating layers, any of the conventionally known insulating materials such as organic high molecular materials and inorganic materials may be used. The organic insulating materials include, without being limited to, glass epoxy resins and polyimide resins. The inorganic insulating materials include, without being limited to, alumina ceramics, crystallized glasses, and mica flakes. It is, however, preferred to use an insulating material with a dielectic constant as small as possible. Especially, it is preferred to use a ceramic dielectric as a material for the insulating layers.

In a preferred embodiment, the insulating layers are made up of a ceramic composition with a low sintering temperature of not more than 1000° C. It is preferred to use a cordierite type ceramic composition consisting essentially of not more than 15% of MgO, 1 to 30% of $Al_2O_3$, 25 to 80% of $SiO_2$, 15 to 70% of CaO, and 1.5 to 5% of $B_2O_3$. This ceramic per se has a dielectric constant of 5 to 10 which varies with its composition. Also, it has a low sintering temperature of 850° to 1000° C., which is considerably lower than the 1500° to 1600° C. of alumina ceramics, thus making it possible to use less expensive or cheap metals or alloys such as silver, silver-paradium alloys, copper, nickel or the like as a material for the internal wiring conductors.

When producing multilayer printed circuit boards with the cordierite type ceramic composition and copper as materials, firing is preferably carried out in a non-oxidizing or reducing atmosphere to prevent the internal wiring conductors from oxidizing. In a preferred embodiment, the firing is carried out in a nitrogen gas atmosphere containing a very small amount of aqueous vapor, generally 99.7 to 99.8 vol % nitrogen atmosphere containing 0.2 to 0.3 vol % of aqueous vapor. In this case, the aqueous vapor is incorporated into the atmosphere to remove carbon, which remains in the insulating layers, by a water gas reaction.

The reasons why the compositional area of the above cordierite ceramic composition has been limited as above are as follows. If the content of MgO exceeds 15%, the sintering temperature becomes higher than 1000° C., thus making it impossible to use cheap metals as a material for internal wiring conductors. The addition of MgO results in a lower thermal expansion coefficient and this effect can be obtained sufficiently even if the content of MgO is 0.1%. However, if the content of MgO is 0, the thermal expansion coefficient becomes larger than $8.0 \times 10^{-6}/°$ C., and a thermal stress, resulting from a difference in the thermal expansion coefficient between the multilayer board and the silicon chips mounted thereon, causes generation of cracks in the silicon chips. For these reasons, the content of MgO has been limited to a value not more than 15%.

The content of $Al_2O_3$ has been confined within the range of from 1 to 30% for the following reasons. If the content of $Al_2O_3$ is less than 1%, the sintering temperature becomes higher than 1000° C., and if the content of $Al_2O_3$ exceeds 30%, the dielectric dissipation factor of the ceramics becomes larger than 0.2%.

The content of $SiO_2$ has been confined within the range of 25 to 80% for the following reasons. If the content of $SiO_2$ is less than 25%, the dielectric constant becomes larger than 10, resulting in an increase in the delay time of signal propagation. If the content of $SiO_2$ exceeds 80%, the strength is reduced to not more than 1500 kg/cm$^2$.

The reasons why the content of CaO has been confined within the range of 15 to 70% are as follows. If the content of CaO is less than 15%, the strength becomes less than 1500 kg/cm$^2$. If the content of CaO exceeds 70%, the dielectric constant becomes larger than 10, resulting in an increase in the delay time of signal propagation.

$B_2O_3$ has a great influence on the sintering temperature. If the content of $B_2O_3$ is less than 1.5%, the sintering temperature becomes higher than 1000° C., and if the content of $B_2O_3$ exceeds 5%, the strength becomes lower than 1500 kg/cm$^2$. For these reasons, the content of $B_2O_3$ has been confined within the range of 1.5 to 5%.

In the multilayer printed circuit board according to the present invention, the internal conductor paths are respectively surrounded by the cavity or porous layers. In other words, the neighboring two internal wiring conductor paths located on any of the insulating layers are separated by the insulator and two layered spaces or porous layers between them. This makes it possible to considerably reduce the capacitance between the neighboring conductor paths as well as to reduce the floating capacitance in the printed circuit.

The provision of cavities or porous layers in the boundaries between the wiring conductor and the insulator results in a decrease in the dielectric constant of the board as a whole. The dielectric constant is further reduced by providing a layered space in the insulating layer. Thus, the present invention makes it possible to minimize the propagation loss and delay of the signals. Also, it is possible to reduce the manufacturing costs of multilayer printed circuit boards since use of the above cordierite ceramic composition as a material for the insulator enable to copper to be used as a material for the internal wiring conductors.

The invention will be further apparent from the following description taken in conjunction with the accompanying drawings which show, by way of examples only, preferred embodiments of the present invention.

DETAILED EXPLANATION OF THE PREFERRED EMBODIMENT

Figure 1:
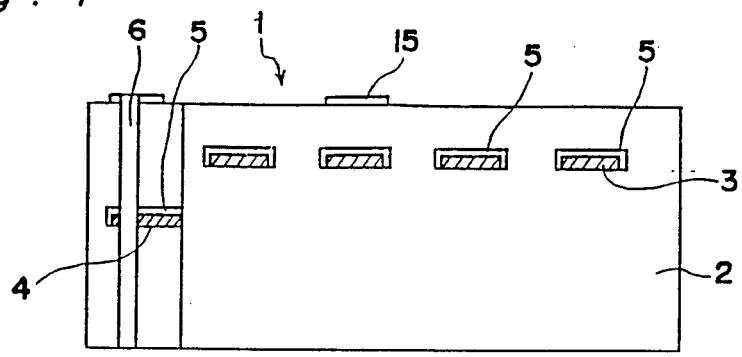
FIG. 1 is a sectional view of a multilayer printed circuit board embodying the present invention.

Referring now to FIG. 1, there is shown a monolithic multilayer printed circuit board 1 embodying the present invention, which comprises monolithic insulating layers 2 and conductor layers each forming various internal conductor paths 3 or 4 and being located on the internal insulating layers 2. At the boundaries between each internal wiring conductor path 3 or 4 and the upper insulating layer 2, there are respectively provided gaps or cavities 5 so as to separate the upper surface area and side areas of the conductor path 3 or 4 from the upper insulating layers 2. The internal wiring conductor paths 3 and 4 are interconnected by via-holes and plated through holes 6.

Figure 2:
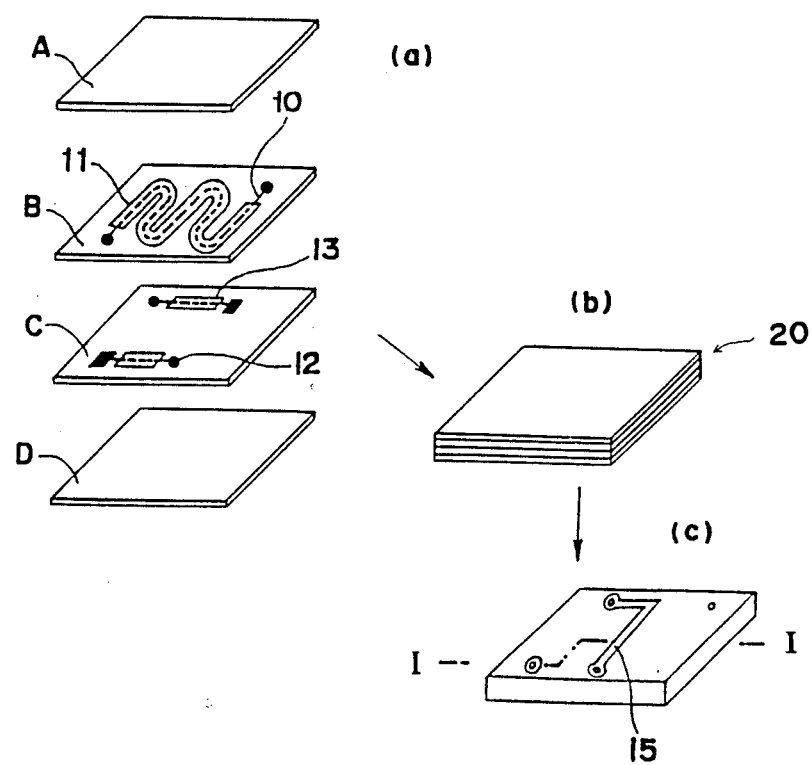
FIG. 2 is an exploded view showing steps for manufacturing the multilayer printed circuit board of FIG. 1.

The multilayer printed circuit board 1 of the above structure may be manufactured, for example, in the following manner. As illustrated in FIG. 2, there are prepared ceramic green sheets A, B, C and D. Conductive paste is printed in the designed pattern on the green sheets B and C to form internal conductor patterns 10 and 12. Combustible paste of an organic compound is printed on the internal conductor patterns 10 and 12 to form a combustible paste layer 11 and 13 respectively. It is preferred not to form any combustible paste layers on the surface areas where plated-through holes 6 should be provided to avoid deformation of conductor paths in the through holes 6.

After being provided with via-holes filled with conductive paste, the green sheets A, B, C and D are stacked under pressure to form a green sheet stack 20 as shown in FIG. 2 (b). The green sheet stack 20 is provided with through holes 6, and a conductor pattern 15 of conductive paste is printed on the stack 20 as shown in FIG. 2 (c). The stack 20 is then fired at temperatures ranging from 850° to 1000° C. in a nonoxidizing atmosphere to complete a multilayer printed wiring board.

During firing, the combustible paste layers 11 and 13 burn and leave small gaps or cavities 5 at the boundaries between the conductor paths 3, 4 and the upper insulating layer.

Figure 3:
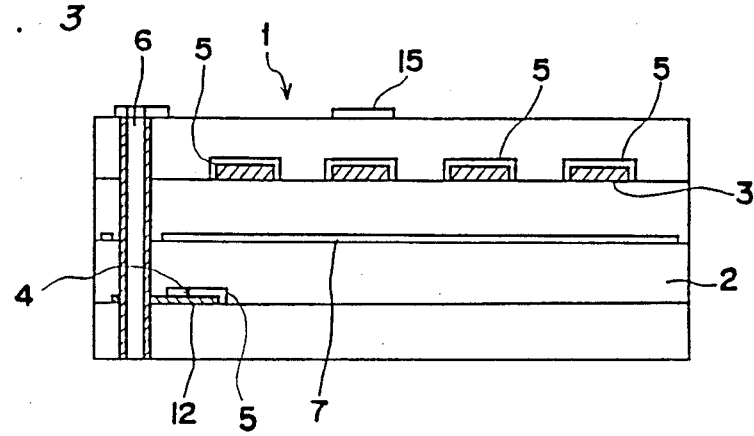
FIG. 3 is a sectional view of a multilayer printed circuit board showing another embodiment of the present invention.
Figure 4:
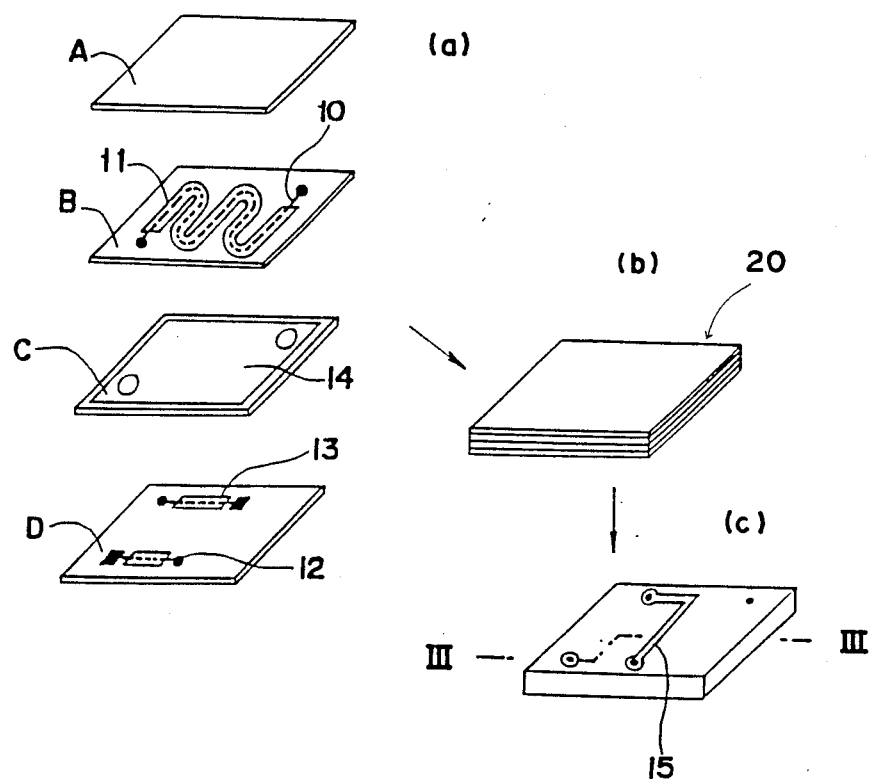
FIG. 4 is an exploded view showing steps for manufacturing the multilayer printed circuit board of FIG. 3.

FIGS. 3 and 4 show another embodiment of a monolithic multilayer printed circuit board 1 of the present invention. The multilayer board 1 comprises monolithic insulating layers 2 and conductor layers each forming various internal conductor paths 3 or 4 and being located on the internal insulating layers 2. At the boundaries between each internal wiring conductor path 3 or 4 and the upper insulating layer 2, there are respectively provided gaps or cavities 5 so as to separate the upper surface area and side areas of the conductor path 3 or 4 from the upper insulating layers 2. The internal wiring conductor paths 3 and 4 are interconnected by via-holes and plated through holes 6. In this embodiment, a layered space or porous layer 7 is provided in the insulating layer 2 except for the area that surrounds the plated-through holes 6.

The above layered space 7 in the insulating layer may be produced, with combustible paste composed of carbon powder dispersed in an organic binder, by the steps of printing or coating the paste on a ceramic green sheet, and then firing it at a suitable temperature. When producing the porous layer 7 in the insulating layer, the combustible paste is added with a certain amount of the calcined powder for the insulating layers, printed on the ceramic green sheet, and then fired at a sintering temperature of the composition for the insulating layers.

EXAMPLE 1

Using powders of $SiO_2$, CaO, $B_2O_3$, $Al_2O_3$, and MgO as raw materials for the insulating layers, there was prepared a mixture by weighing and mixing to produce a ceramic dielectric composition consisting essentially of 80% of $SiO_2$, 15% of CaO, 2.0% of $B_2O_3$, 2.0% of $Al_2O_3$ and 0.3% of MgO. The mixture was then milled, calcined at 900° C. and then powdered to prepare calcined powder. The resultant powder was added with a suitable amount of an organic solvent and organic binder to prepare a slurry. Using the slurry, a ceramic green sheet with a thickness of 100 microns was prepared by the Doctor blade process and then cut into wafers as shown in FIG. 2.

Using the prepared ceramic green wafers, there were prepared multilayer printed circuit boards in the manner as mentioned above. Copper paste was used as a conductive paste for the internal conductor patterns 10, 12 and 15. The combustible patterns 11 and 13 were printed with varnish. The firing was carried out at 1000° C. in a nitrogen atmosphere containing 0.2 vol % of aqueous vapor.

A section of the multilayer printed circuit board thus prepared showed that there are cavities 5 resulting from burning of the combustible paste between the internal conductor paths 3, 4 and ceramic layers 2 just above the conductor paths. The propagation delay time of signals was about 7 nsec/m.

COMPARATIVE EXAMPLE 1

Using the wafers from the ceramic green sheet prepared in Example 1, a comparative specimen was prepared in the following manner. Copper paste was printed in the same patterns as those in Example 1 on the wafers of the ceramic green sheet to form conductor patterns 10 and 12 and then dried. The printed green wafers were provided with via-holes into which copper paste was filled, and then piled up on one another under pressure to form a stack. After being provided with through holes 5 and an external conductor pattern 15 of copper paste, the stack was then fired in the same nitrogen atmosphere at 1000° C. to prepare a completed multilayer printed circuit board.

A measurement of electrical properties showed that the resultant multilayer circuit board had a dielectric constant of 6 and a propagation delay time of signals of about 8 nsec/m.

Comparing the results for the Example 1 and Comparative Example 1, the multilayer printed circuit board of the present invention has superior electrical properties even through their insulating layers are made up of the same material. The multilayer board of the present invention has a small in the propagation time and possesses excellent properties comparable to those provided by multilayer printed circuit boards made of a dielectric material with a dielectric constant of 4.

EXAMPLE 2

Using powders of $SiO_2$, CaO, $B_2O_3$, $Al_2O_3$, and MgO as raw materials for insulating layers, there was prepared a mixture by weighing and mixing to produce a ceramic dielectric composition consisting essentially of 80% of $SiO_2$, 15% of CaO, 2.0% of $B_2O_3$, 2.0% of $Al_2O_3$ and 0.3% of MgO. The mixture was then milled, calcined at 900° C. and then powdered. After being mixed with a suitable amount of an organic solvent and organic binder, the calcined powder was shaped into a ceramic green sheet of a thickness of a 100 microns by the Doctor blade process, and then cut into wafers.

As shown in FIG. 4 (a), conductive paste of copper powder dispersed in an organic vehicle was printed in the designed pattern on the wafers B and D to form internal conductor patterns 10 and 12, and a combustible paste 14 mainly containing carbon powder was printed on the green sheet C except for the areas occupied by the through holes 6 and its bordering portion. In this embodiment, combustible paste composed of varnish was printed on the internal conductor patterns 10 and 12.

After being provided with via-holes filled with conductive paste, the wafers A, B, C and D were placed on one another under pressure to form a stack 20 as shown in FIG. 4 (b). The stack 20 was provided with through holes 6, and a conductor pattern 15 of conductive paste was then printed on the stack 20 as shown in FIG. 4 (c). The stack 20 was then fired at temperatures ranging from 850° to 1000° C. in a nitrogen atmosphere containing 0.2 vol % of aqueous vapor to complete a multilayer printed circuit board.

A section of the multilayer printed circuit board thus prepared showed that there is a layered space 7 resulting from burning of the combustible paste 14 between the ceramic layers 2. The propagation delay time of signals for the resultant board was 7 nsec/m.

COMPARATIVE EXAMPLE 2

Using the wafers from the ceramic green sheet prepared in Example 1, a comparative specimen was prepared in the following manner. Copper paste was printed in the same patterns as those in Example 1 on the wafers B and D, and then dried. The printed green sheets were provided with via-holes into which copper paste was filled, and then piled up on one another under pressure to form a stack. After being provided with through holes 6 and an external conductor pattern 15 of copper paste, the stack was then fired in the same nitrogen atmosphere at 1000° C. to complete a multilayer printed circuit board.

A measurement of electrical properties showed that the resultant multilayer circuit board had a dielectric constant of 6 and a propagation delay time of signals of about 8 nsec/m.

Comparing the results of Example 2 and Comparative Example 2, the provision of a layered space in the insulating layer reduced the dielectric constant of the multilayer printed circuit board. The multilayer board of the present invention has a small propagation time and possesses excellent electrical properties comparable to those of multilayer printed circuit boards made of a dielectric material with a dielectric constant of 4.

In the foregoing embodiment, the gaps or cavities were prepared by applying the combustible paste on the pattern of the internal conductor paste, and then firing the same during sintering of the ceramic composition. However, the cavities may be produced by using a mixture of a ceramic powder and a combustible material instead of the combustible paste. By firing the mixture printed on the wiring pattern, the combustible material was burned during sintering to form a porous ceramic layer made up of a ceramic composition so that the fine pores in the porous ceramic layer contribute to a decrease in the dielectric constant of the insulator.

Further, when thick internal wiring conductor patterns are provided on the ceramic green sheets, it is preferred to provide cavities surrounding the upper or lower surface and opposite sides of the internal wiring conductors.

What is claimed is:

1. A multilayer printed circuit board comprising monolithic insulating layers and an internal wiring conductor layer located on a surface of at least one of said insulating layers and forming an internal conductor path, said conductor path in said internal conductor layer being locally separated from an adjacent insulating layer by a closed internal cavity located about said internal conductor path which reduces the dielectric constant of said multilayer printed circuit board.

2. A multilayer printed circuit board claimed in claim 1 wherein said insulating layers are made up of a ceramic composition with a low sintering temperature of not more than 1000° C.

3. A multilayer printed circuit board claimed in claim 2 wherein said ceramic composition is a dielectric ceramic composition consisting essentially of 1 to 30% of $Al_2O_3$, 25 to 80% of $SiO_2$, 15 to 70% of CaO, and 1.5 to 5% of $B_2O_3$.

4. A multilayer printed circuit board claimed in claim 1 wherein said conductor path in said internal conductor layer is separated from said adjacent insulating layer by a porous layer provided in said cavity between said adjacent insulating layer and said conductor layer.

5. A multilayer printed circuit board comprising monolithic insulating layers with at least one plated hole or through hole and an internal wire conductor layer located on a surface of at least two of said insulating layers and forming internal conductor paths interconnected by said plated hole or through hole;

at least one of said internal insulating layers being positioned between said internal conductor layers and being formed with a closed internal layered space or porous layer extending substantially throughout the width of said internal insulating layer except for the area of said internal insulating layer in which the plated hole or through hole passes therethrough.

6. A multilayer printed circuit board comprising:

a plurality of monolithic insulating layers;

an internal wiring conductor layer formed on a surface of at least one of said insulating layers;

at least one plated through hole which passes through said board and conductively contacts said internal conductor layer;

said internal wiring conductor layer being at least partially separated from an adjacent insulating layer by a closed internal region located about said internal conductor and containing means for reducing the dielectric constant of said multilayer printed circuit board;

said means being selected from the group consisting of a cavity and a porous layer; and said closed internal region being spaced away from said through hole.

* * * * *